(12) United States Patent
Casado et al.

(10) Patent No.: US 9,318,112 B2
(45) Date of Patent: Apr. 19, 2016

(54) RECOGNIZING SPEECH IN THE PRESENCE OF ADDITIONAL AUDIO

(71) Applicant: Google Inc., Mountain View, CA (US)

(72) Inventors: Diego Melendo Casado, San Francisco, CA (US); Ignacio L. Moreno, New York, NY (US); Javier Gonzalez-Dominguez, Madrid (ES)

(73) Assignee: Google Inc., Mountain View, CA (US)

( * ) Notice: Subject to any disclaimer, the term of this patent is extended or adjusted under 35 U.S.C. 154(b) by 93 days.

(21) Appl. No.: 14/181,345

(22) Filed: Feb. 14, 2014

(65) Prior Publication Data

US 2015/0235637 A1   Aug. 20, 2015

(51) Int. Cl.
*G10L 15/00* (2013.01)
*G10L 15/22* (2006.01)
*G10L 17/00* (2013.01)

(52) U.S. Cl.
CPC .............. *G10L 15/222* (2013.01); *G10L 17/00* (2013.01)

(58) Field of Classification Search
None
See application file for complete search history.

(56) References Cited

U.S. PATENT DOCUMENTS

| | | | |
|---|---|---|---|
| 6,314,402 B1 | 11/2001 | Monaco et al. | |
| 7,162,421 B1 | 1/2007 | Zeppenfeld et al. | |
| 7,315,613 B2 * | 1/2008 | Kleindienst | H04M 1/72547 379/88.01 |
| 7,392,188 B2 | 6/2008 | Junkawitsch et al. | |
| 8,073,699 B2 * | 12/2011 | Michelini | G10L 15/1815 379/265.02 |
| 8,527,270 B2 * | 9/2013 | Precoda et al. | 704/240 |
| 8,566,104 B2 * | 10/2013 | Michelini | G10L 15/1815 379/265.02 |
| 2008/0152095 A1 * | 6/2008 | Kleindienst | H04M 1/72547 379/88.13 |
| 2012/0029904 A1 * | 2/2012 | Precoda et al. | 704/2 |
| 2014/0128004 A1 * | 5/2014 | Muralidhar et al. | 455/67.11 |
| 2015/0110263 A1 * | 4/2015 | Johnston et al. | 379/430 |
| 2015/0112671 A1 * | 4/2015 | Johnston et al. | 704/233 |
| 2015/0112684 A1 * | 4/2015 | Scheffer et al. | 704/257 |

* cited by examiner

*Primary Examiner* — Satwant Singh
(74) *Attorney, Agent, or Firm* — Fish & Richardson P.C.

(57) ABSTRACT

The technology described in this document can be embodied in a computer-implemented method that includes receiving, at a processing system, a first signal including an output of a speaker device and an additional audio signal. The method also includes determining, by the processing system, based at least in part on a model trained to identify the output of the speaker device, that the additional audio signal corresponds to an utterance of a user. The method further includes initiating a reduction in an audio output level of the speaker device based on determining that the additional audio signal corresponds to the utterance of the user.

20 Claims, 4 Drawing Sheets

RECOGNIZING SPEECH IN THE PRESENCE OF ADDITIONAL AUDIO

TECHNICAL FIELD

This disclosure generally relates to speech recognition.

BACKGROUND

Automatic speech recognition can be used in mobile devices and other devices. In general, automatic speech recognition attempts to provide accurate transcriptions of what a person has said.

SUMMARY

In one aspect, this document describes a computer-implemented method that includes receiving, at a processing system, a first signal including an output of a speaker device and an additional audio signal. The method also includes determining, by the processing system, based at least in part on a model trained to identify the output of the speaker device, that the additional audio signal corresponds to an utterance of a user. The method further includes initiating a reduction in an audio output level of the speaker device based on determining that the additional audio signal corresponds to the utterance of the user.

In another aspect, the document describes a system that includes one or more computers and one or more storage devices storing instructions. The instructions are operable, when executed by the one or more computers, to cause the one or more computers to perform various operations. The operations include receiving a first signal comprising an output of a speaker device and an additional audio signal. The operations also include accessing a model trained to identify the output of the speaker device, and determining, based, at least in part on the model, that the additional audio signal corresponds to an utterance of a user. The operations further include initiating a reduction in an audio output level of the speaker device based on determining that the additional audio signal corresponds to the utterance of the user.

In another aspect, the document describes one or more machine-readable storage devices storing instructions that, upon execution by one or more processing devices, cause the one or more processing devices to perform various operations. The operations include receiving a first signal comprising an output of a speaker device and an additional audio signal, and determining, based at least in part on a model trained to identify the output of the speaker device, that the additional audio signal corresponds to an utterance of a user. The operations also include initiating a reduction in an audio output level of the speaker device based on determining that the additional audio signal corresponds to the utterance of the user.

Implementations of the above aspects may include one or more of the following.

The dialog manager can receive a second signal in which an effect of the output of the speaker device is less than that in the first signal, and the second signal can be provided to a speech recognition engine. The output of the speaker device can be based on an output of a text-to-speech system. A transcription corresponding to the utterance of the user can be generated by a transcription engine. A first vector corresponding to the first signal can be received, for example, by the dialog manager, and the first vector can be compared to a second vector corresponding to the model. A presence of the additional audio signal can be determined if a result of the comparison satisfies a threshold condition. A presence of the additional audio signal can also be determined if the first vector satisfies a threshold condition. The model can be an i-vector based model. The model can be a neural network based model. The model can jointly represent a user voice and the output of the speaker device.

Other embodiments of this aspect include corresponding systems, apparatus, and computer programs recorded on computer storage devices, each configured to perform the operations of the methods.

Particular embodiments of the subject matter described in this specification can be implemented so as to realize one or more of the following advantages. A more natural human-like spoken interaction can be facilitated between a user and a computing device. Accurate speech recognition can be performed in the event of a "barge-in" by the user during a time when audio from a text-to-speech system, media player, or navigation system is being played back.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
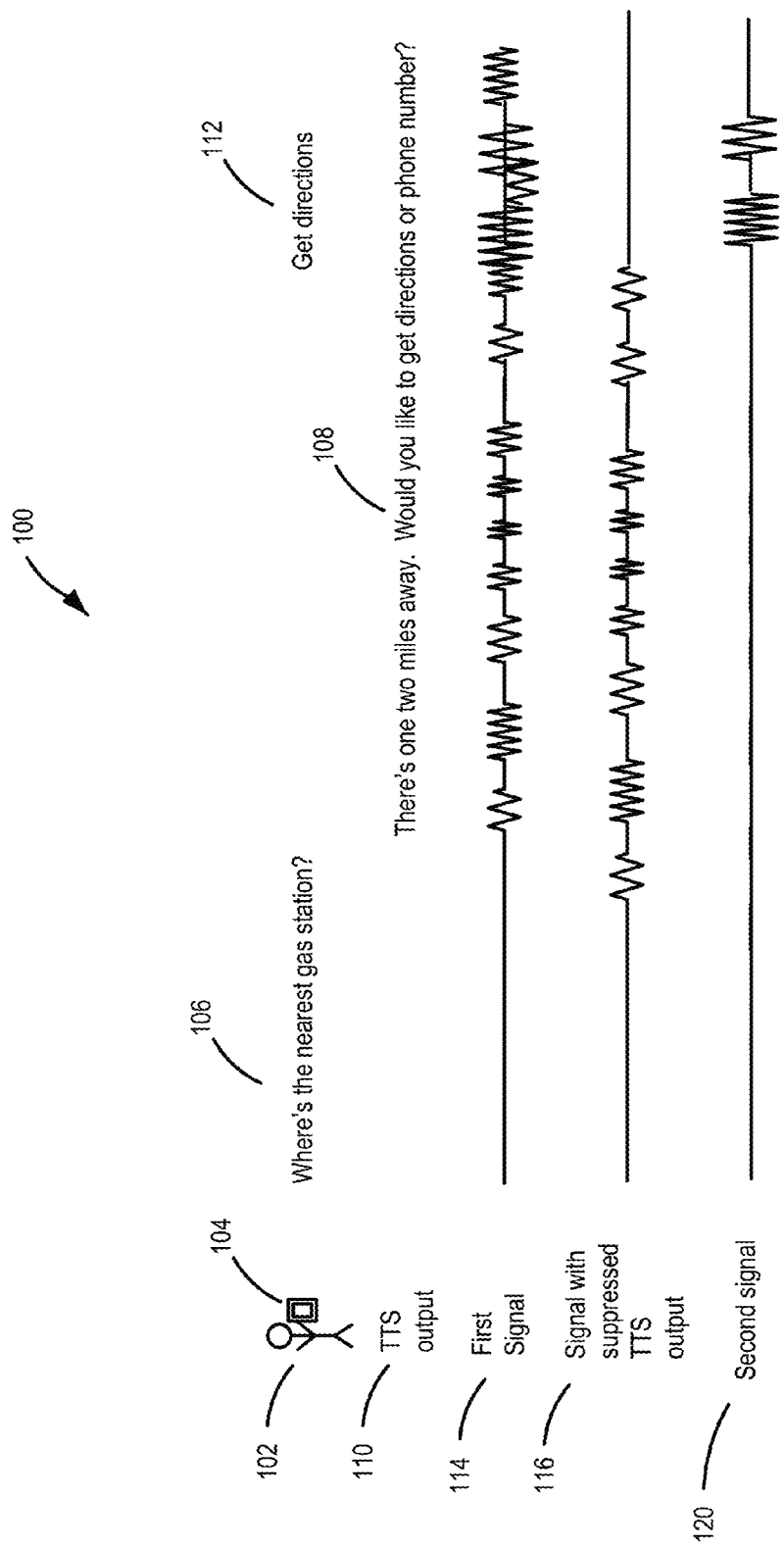
FIG. 1 is a diagram of example signals and utterance during a voice-based exchange between a user and a computing device.

Voice-based interactions with computing devices such as smart phones allow for hands-free input, for example, for searching the web, launching an application, storing an appointment, asking a question, getting directions, playing media, or performing another action on the computing device. In response to a voice-based query from a user, the computing device often plays back synthesized audio via a text-to-speech (TTS) system. In some cases, the TTS output played back in response to a query is long, and the user may get the desired information by listening to only a portion of the TTS output. In other cases, the user may decide that the played back TTS output is not providing the desired information, and that a separate spoken query is needed. In such cases, the user may need to "barge in" with another query or other spoken input during a time when the TTS output is still being played back by the computing device. For example, a user can barge in by speaking a predetermined word or phrase (e.g., "stop" or "new query"), or simply ask another question. If the microphone of the computing device is switched on to accept such interruptions by the user, the microphone also captures the audio output from the TTS system. Unless the TTS output is suppressed from the audio captured by the microphone, the TTS output is fed back to the speech recognizer and can affect the accuracy of the speech recognizer in recognizing the actual user input.

In some implementations, the audio that needs to be suppressed may come from sources other than a TTS system. For example, a user may provide a spoken input in the presence of audio output from a media player or navigation system, and a suppression of such audio output may be required for accurately recognizing the spoken input from the user. While this document uses a TTS output as an example of audio that is suppressed for accurate speech recognition, the technology can be used for suppressing other types of audio (e.g., outputs of a media player or navigation system) without deviating from the scope of this disclosure.

The TTS output can be suppressed from the captured audio in multiple ways. For example, adaptive filtering (e.g., echo cancellation techniques) can be used to suppress the TTS output. However, such adaptive filtering is often not adequate to suppress the TTS output, and may also distort the spoken input from the user, thereby affecting recognition accuracy. For example, the known signal that is subtracted using echo cancellation techniques may be misrepresented in the captured audio due to latency in the audio path, distortion added by a speaker, or echoes and distortions produced by the physical channel. This document describes techniques for detecting a presence of spoken input in the captured audio using, for example, a model for the synthesized voice of the TTS output. In the techniques described herein, a deviation from the model can be attributed to the presence of additional audio such as an utterance, and accordingly, the audio output from the TTS system can be reduced to accurately capture the additional audio. In some implementations a model jointly representing the synthesized voice and a user utterance can also be used to detect "barge-in" situations.

FIG. 1 is a diagram of example signals and utterance 100 during a voice-based exchange between a user 102 and a computing device 104 such as a smartphone. In the example depicted in FIG. 1, the user 102 provides a voice-based input to the computing device 104 by uttering the question 106: "Where's the nearest gas station?" In response to the question 106, the computing device 104 provides an audible response 108 as an output 110 from a text-to-speech (TTS) system associated with the computing device 104. In this particular example, the response 108 to the question 106 is: "There's one two miles away. Would you like to get directions or phone number?" In some cases, the user 102 may not need to listen to the entire response 108 before providing a follow up instruction 112 at a time when the TTS output 110 is still being played back. In this particular example, the user 102 starts providing the instruction 112: "Get directions," such that the instruction 112 overlaps with the response 108. As a result, a microphone of the computing device 104 captures an audio signal that includes both the TTS output 110, as well as the instruction 112 provided by the user. This is represented as the first signal 114 in FIG. 1. The event of a user providing voice-based input (e.g., the instruction 112) during a time when a TTS output 110 is being played may sometimes be referred to as a "barge-in."

This document describes techniques for suppressing the TTS output 110 from the first signal 114, such that a second signal 120 representing the utterance corresponding to the instruction 112 can be recognized. Upon detection of an additional audio signal (e.g., the spoken instruction 112) within the first signal 114, an audio level corresponding to the TTS output 110 can be reduced or even completely turned down to facilitate recognition of the instruction 112. The signal 116 represents such suppression of the TTS output.

Figure 2:
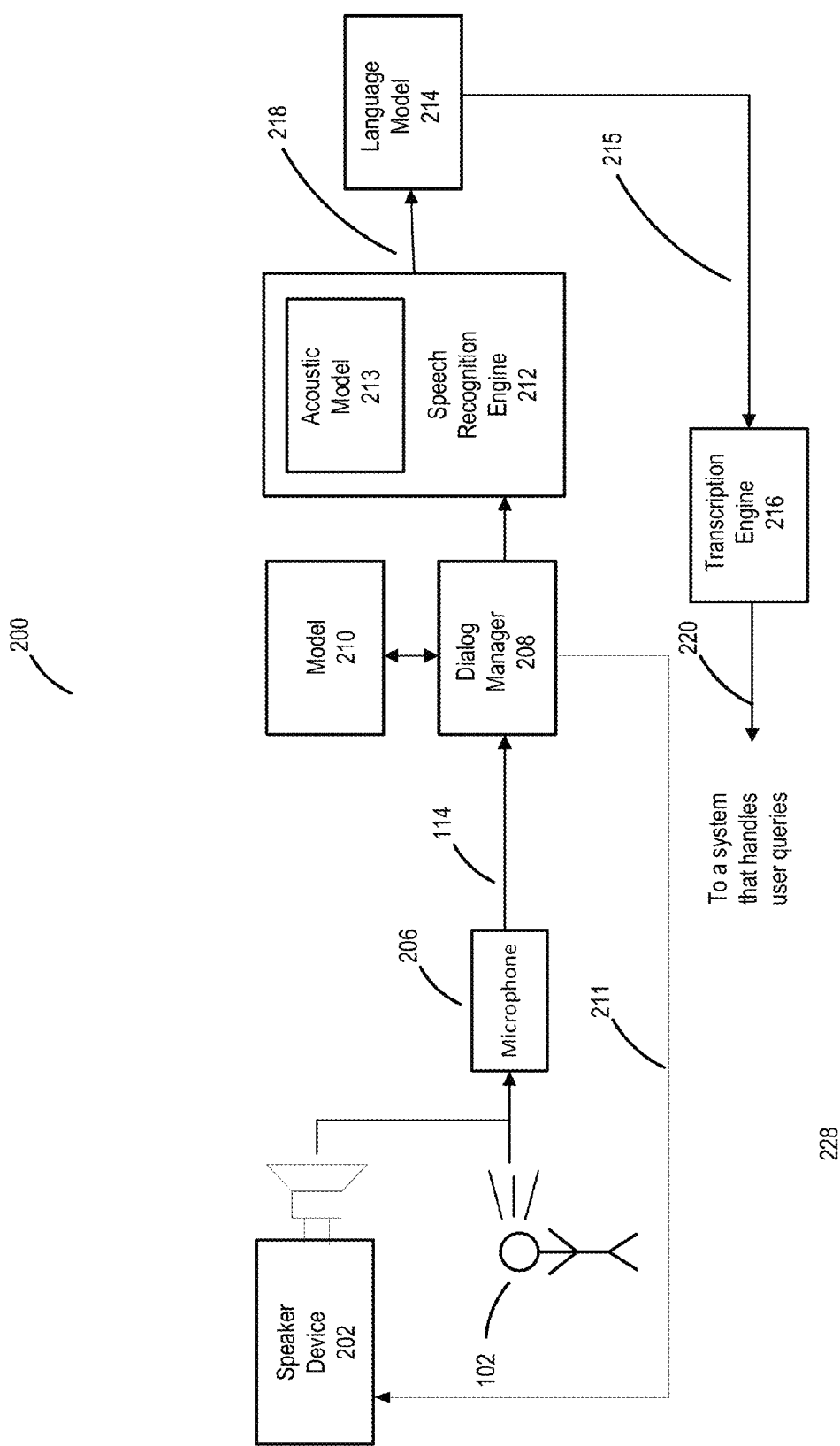
FIG. 2 is a diagram of an example system that identifies speech in the event of a barge-in by the user.

FIG. 2 is a diagram of an example system 200 that identifies speech in the event of a barge-in by the user 102. The system 200 includes a speaker device 202 that provides an audio output, for example, from a TTS system that generates the audio from text-based transcription data. In some implementations, the speaker device 202 can be a part of a larger system (e.g., a TTS system, a media player, or a navigational system) that provides audio outputs. In some implementations, another system, such as one that renders symbolic linguistic representations (e.g., phonetic transcriptions) to speech may also be used either in conjunction with or in the place of the TTS system. During a barge-in event, both audio output from the speaker device 202 and utterance by the user 102 are captured by the microphone 206, and the system 200 has to identify the utterance from the captured audio.

In some implementations, the system 200 includes a dialog manager 208 that receives the signal (also referred to as the first signal) 114 captured by the microphone 206. The dialog manager 208 can be configured to detect "barge-in" situations, i.e. situations in which a user provides a spoken input during which an audio signal is being output from the speaker device 202. In some implementations, the dialog manager 208 can be configured to deactivate the speaker device 202, or at least initiate a reduction in the level of audio output coming out of the speaker device 202, upon detecting an additional audio signal within the first signal 114. This can improve dialog efficiency between the user 102 and the system 200 by allowing the system 200 to receive and recognize spoken input prior to completion of an output played back via the speaker device 202. This in turn allows for an interaction between the user 102 and the system 200 to be more natural, as the system 200 can be configured to demonstrate a human-like turn-taking behavior.

In some implementations, the dialog manager 208 detects the presence of the additional audio within the first signal 114 by accessing a model 210 of the audio output coming out of the speaker device 202. For example, if the speaker device 202 outputs a synthesized voice from a TTS system, the model 210 can be trained to represent a voice-model of the synthesized voice. The voice-model representing the synthesized voice can also be referred to as a "fingerprint" of the synthesized voice. In such cases, the model 210 can be trained, for example, using samples of speech previously generated by the TTS system. In some implementations, the training of the model 210 can be performed off-line using a large number of samples. For example, for generating a model of synthesized speech coming out of a TTS system, several million previously generated samples can be used. Similarly, previous audio samples coming from a navigation system can be used for training a corresponding model. In general, a large number of samples results in an accurate model of the synthesized speech. In some cases though, the increase in accuracy may be incremental as the number of samples is increased beyond a threshold. Therefore, the number of samples used in training the model 210 can be chosen based on an accuracy required for a corresponding application. In some cases, the model 210 can be improved by supplementing the off-line training with on-line updates.

In some implementations, the model 210 can use a fingerprint of a user voice to accurately detect the user's speech in the presence of various types of other audio. For example, if the model 210 is trained to represent the voice of a particular user, the particular user's voice can be detected in the presence of, for example, audio coming out of a media player. In such cases, the user's voice can be detected, for example, by determining that a confidence in the model is above a threshold condition.

In some implementations, to train the model 210 to represent a voice coming from a media device, it can be assumed that the audio corresponding to a predetermined time (e.g., the last T seconds) comes from the same speaker. In such cases, the audio can be used to train the model 210 to represent the speaker. The operation can be repeated over and over while any voice is detected.

The model 210 can represent the synthesized speech (or other audio emanating from the speaker device 202) using a set of vectors. For example, the model 210 can be represented using a set of "i-vectors" or vectors provided by a neural network classifier. In general, the dialog manager 208 can be configured to detect an additional audio in the first signal by comparing one or more vectors generated from the first signal 114 with reference vectors representing the model 210. For example, if the model 210 is an i-vector based model, the dialog manager can compare an i-vector generated from the first signal to a reference i-vector representing the model 210. If the i-vector generated from the first signal is sufficiently similar to the reference i-vector, the dialog manager can conclude that no additional audio is present in the first signal and therefore take no action. Alternatively, if the i-vector generated from the first signal is sufficiently different from a reference i-vector representing the model 210 (i.e., the comparison satisfies a threshold condition), the dialog manager can conclude that an additional audio is present in the first signal 114. Upon detecting the additional audio, the dialog manager can initiate a reduction in the audio output level of the speaker device 202 by sending a control signal 211 to the speaker device 202. In some implementations, the control signal 211 may cause the speaker device 202 to switch off, such that only the additional audio is captured by the microphone 206. Alternatively, the control signal 211 can cause a reduction in the audio output level from the speaker device 202. Upon reduction of the audio output level of the speaker device 202, the signal captured by the microphone 206 (referred to in FIG. 1 as the second signal 120) is passed on by the dialog manager 208 to a speech recognition engine 212.

Various techniques can be used to generate the model 210 using training data. In some implementations, a Factor Analysis (FA) paradigm can be used to account for variability (such as background noise or different communication channels) in the training data. An FA paradigm aims to express the main "factors" contributing to the observed variability. In some implementations, techniques such as Join Factor Analysis (JFA) or Total Variability Model (TVM) can also be used. In the JFA technique, the acoustic space can be divided into different subspaces that can are used to independently model factors associated with variability (e.g., inter-speaker variability or environmental variability across different sessions of data collection) in the training data. In case of TVM, the sources of variability (both speaker and session) are modeled together in a single space of multiple dimensions.

In each of the above techniques, a synthesized voice (or a voice of a human speaker, if a user voice-model is included) can be represented as a vector of a given dimension. For example, in case of TVM, the vector of latent factors for a given utterance (coming from the speaker device 202, or the user 102) is referred to as an i-vector. In general, i-vectors are considered sufficient to represent the differences between various utterances. Variability and speaker information can be separated in the i-vector domain using techniques such as Linear Discriminant Analysis (LDA) or Within Class Covariance Normalization (WCCN). Cosine distances can be used to compare two i-vectors (e.g., a reference i-vector from the model 210, and a second i-vector computed from the first signal 114). Probabilistic Linear Discriminant Analysis (PLDA) may also be used in the i-vector space under a probabilistic framework. When using PLDA, a hypothesis test can be used for i-vector matching.

In some implementations, to generate an i-vector for a given utterance, the utterance is first represented in terms of a large Gaussian mixture model (GMM) (e.g., a Universal Background Model (UBM)), which can be parameterized by $\lambda$. A sequence of spectral observations can be computed from the utterance as:

$$\Theta = (o_1, \ldots, o_O); o_t \in \mathbb{R}^D$$

wherein D is the dimensionality of the observation vectors. The accumulated and centered first-order Baum-Welch statistics can then be computed as:

$$N_m = \sum_{t=1}^{O} P(m \mid o_t, \lambda)$$

$$F_m = \sum_{t=1}^{O} P(m \mid o_t, \lambda)(o_t - \mu_m),$$

where $\mu_m$ is the mean vector of mixture components m (m=1, ..., C) of the UBM, and $P(m|o, \lambda)$ is the Gaussian occupation probability for mixture m and observation o. A vector containing the stacked statistics is defined as:

$$F = F_1^T, \ldots, F_C^T)^T; F \in \mathbb{R}^{CD}$$

An i-vector associated with the sequence $\Theta$ is denoted as:

$$x \in \mathbb{R}^d$$

where, according to TVM, the vector F is related to x via the rectangular low-rank matrix $$T \in \mathbb{R}^{CD \times d}$$

known as the total variability (TV) subspace:

$$N^{-1}F = Tx$$

where $$N \in \mathbb{R}^{CD \times CD}$$

is a diagonal matrix with C blocks of size D×D along the diagonal. Block m=1, ... C, is the matrix:

$$N_m I_{(D \times D)}$$

Therefore, the i-vector formulation transforms the sequence of D dimensional vectors, into a single vector per utterance, the single vector carrying information about the speaker. The dimensionality of the i-vector is denoted as d.

The constraints imposed on the distributions of P(x) and P(F|x) lead to a closed-form solution for P(x|F). In the technique described above, the i-vector is the mean of this distribution, and given by:

$$x = (I + T^T \Sigma^{-1} N T)^{-1} T^T \Sigma^{-1} F$$

The i-vector extraction procedure described above depends on utterance data and the TV model parameters $\lambda$, T, and $\Sigma$. Other methods of determining i-vectors are also within the scope of this disclosure.

In some implementations, the model 210 alternatively or in addition includes a voice-model of the user 102. Such a voice-model can be referred to as a fingerprint of the user's voice. Such a voice-model of the user voice can be generated, for example, by collecting samples of the user's voice. In some implementations, the collected samples are used to train the voice-model of the user locally, for example, on a mobile device housing portions of the system 200. Alternatively, the collected voice samples can be provided to a remote computing device (e.g., a server) that updates the voice-model corresponding to the user.

If the model 210 includes a voice-model of the user together with a voice-model for the synthesized voice, the dialog manager can be configured to take various actions upon identifying a source of the audio in the first signal 114. For example, if the dialog manager 208 determines that only the user 102 is speaking, the dialog manager can determine that the user 102 should not be interrupted, and accordingly delay or cancel any output about to be output from the speaker device 202. If a combination of the user voice and the synthesized voice is detected, the dialog manager 208 may initiate a reduction of the audio output level coming out of the speaker device 202. A combination of the user voice and the synthesized voice can be detected, for example, by combining scores or vectors from the individual voice-models corresponding to the synthesized voice and user voice, respectively. If only the presence of the synthesized voice is detected (possibly together with noise such as background music, or environmental noise), the dialog manager 208 may decide to take no action, and allow an output from the speaker device 202 to continue. In some implementations, where the model 210 includes a voice-model for a particular user 102, the voice-model may be used to differentiate one user from others. In such cases, speech from other users may be classified as noise, and treated accordingly by the dialog manager 208. This way, interruption of the speaker device can be personalized for a particular user, and made secure.

Upon receiving a second signal 120 in which the effect of the speaker device output is reduced, the dialog manager forwards the signal to a speech recognizing system 212. While FIG. 2 depicts the dialog manager 208 separately from the speech recognition engine 212, some implementations can include the dialog manager 208 as a part of the speech recognition engine 212. The speech recognition engine 212, in turn, provides an output 218 obtained by recognizing the utterance of the user in the second signal 120. The output 218 is provided to a language model 214 which outputs information representing words and/or phrases. The output 220 of the language model is then provided to a transcription engine 216 that converts the recognized words and/or phrases to text. The output of the transcription engine can then be provided to a system configured to handle user queries. For example, the output of the transcription engine can be provided to a semantic parser that transforms text into a structured representation suitable for processing by a particular application.

In some implementations, the signal (e.g., the first signal 114, or the second signal 120) captured by the microphone 206 may be sampled at a particular frequency and resolution. For example, the signals may be sampled at 8 kHz, 16 kHz, 44.1 kHz, or any other sample rate, and the resolution may be 16 bits, 32 bits, or any other resolution.

In some implementations, the speech recognition engine 212 can be configured to extract acoustic features from a received signal and classify the extracted acoustic features separately using one or more acoustic models 213. The acoustic features extracted from the signals can be represented using, for example, mel-frequency cepstral coefficients, cepstral coefficients, spectral vectors, spectrograms, filterbank energies, fast Fourier transform (FFT) frames or other time-frequency or frequency domain representations. In some implementations, the extracted acoustic features may be represented as one or more feature vectors. The acoustic features can be extracted using a processor either included within, or external to the system 200. In some implementations, the processor may generate the acoustic features based on one or more audio frames corresponding to signal received at the speech recognition engine 212. In some implementations, the audio frames may be, for example, between ten and twenty-five milliseconds in length.

In general, an acoustic model 213 can be configured to establish statistical representations for the features or feature vectors extracted from the signal received at the speech recognition engine 212. Various types of acoustic models 213 can be used by the speech recognition engine 212. For example, the acoustic model 213 can be a classifier such as a neural network. In other implementations, the acoustic model 213 can include a Gaussian mixture model (GMM), a Hidden Markov Model (HMM), a segmental model, a super-segmental model, a hidden dynamic model, a maximum entropy model, or a conditional random field.

The output 218 from the speech recognition engine 212 can be a vector of ordered pairs of speech units (e.g., phonemes or tri-phones) and corresponding weights. In some implementations, the output of the speech recognition engine 212 can be a vector that includes a weight (also referred to as a score or probability) for each known phoneme in a given language. In some implementations, the output 218 can be provided to a language model 214 that determines a likelihood of word and phrase sequences from the speech units (e.g., phonemes) in the output 218. The language model 214 can be used, for example, to capture properties of the language (e.g. English) being recognized, and predict the next word in a sequence. Therefore, the language model 214 may be used to constrain a search among alternative word or phrase sequence hypotheses during recognition. For example, the language model 214 can be used to determine whether the speaker likely said "let's recognize speech," or "let's wreck a nice beach," from similar sounding sequence of phonemes. The language model 214 can be, for example, a unigram model, an n-gram model, or another model such as a positional language model, factored language model, or cache language model. Even though FIG. 2 shows the language model 214 to be external to the speech recognition engine 212, the language model 214 can also be implemented as a part of the speech recognition engine 212. The language model can be implemented as a separate hardware module, or using a processor that executes appropriate machine readable instructions to perform the above-mentioned functionalities.

In some implementations, the output 215 of the language model 214 can be provided to a transcription engine 216 that generates text-based strings based on the output 215. In some implementations, the text strings generated as an output 218 of the transcription engine 216 can be provided to a system that can handle user queries. For example, the output 220 of the transcription engine can be provided to a semantic parser that transforms text into a structured representation suitable for processing by a particular application that processes user queries.

Figure 3:
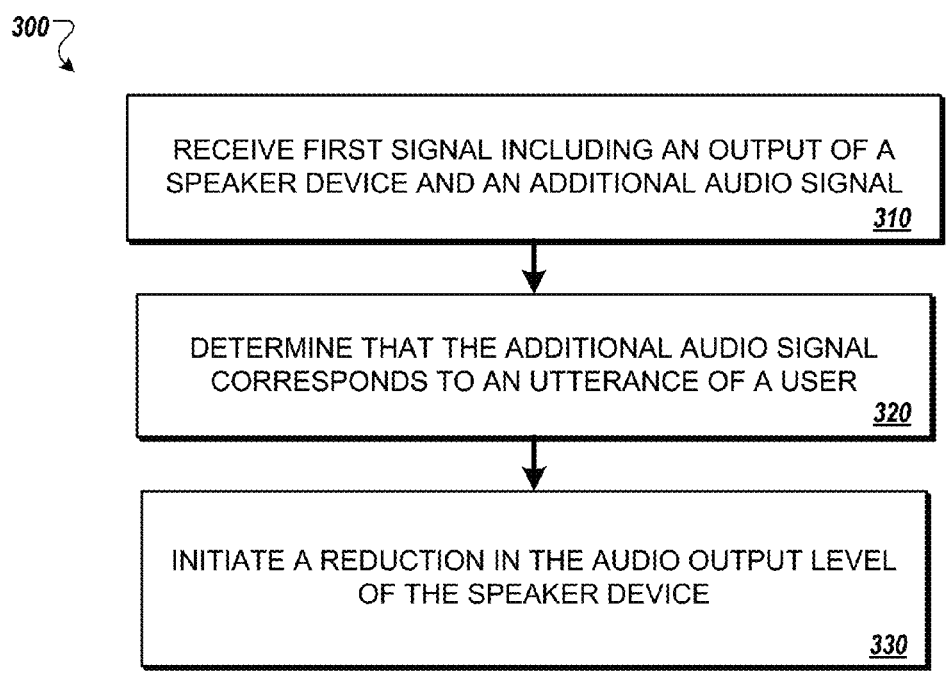
FIG. 3 is a diagram of an example process for identifying speech in the event of a barge-in by the user.

FIG. 3 is a diagram of an example process 300 for identifying speech in the event of a barge-in by the user. The process 300 may be performed, for example, by one or more processors used within the system 200 of FIG. 2. In some implementations, at least a part of the process 300 can be performed by a processor included within a dialog manager 208 of the system 200. The process 300 includes receiving a first signal that includes an output of a speaker device as well as an additional audio signal (310). In some implementations, the output of the speaker device can be based on an output of a TTS system. In some implementations, the output of the speaker device can be based on an output signal received from a media player or a navigation system.

The process also includes determining that the additional audio signal corresponds to an utterance of a user (320). The determination can be done, for example, based at least in part on a model trained to identify the output of the speaker device. The model can be substantially same as the model 210 described with reference to FIG. 2. For example, the model can be an i-vector based model or a neural network based model. In some implementations, the model can represent only a user voice, or jointly represent a user voice and the output of the speaker device. In such cases, the determination can be made, for example, based on a first model trained to identify the output of the speaker device, and a second model trained to identify an utterance of a user.

In some implementations, the determination can include obtaining a vector (e.g., an i-vector) corresponding to the first signal. The obtained vector can then be compared to a reference vector corresponding to the model, and the presence of the additional audio signal can be determined if a result of the comparison satisfies a threshold condition. For example, if a cosine distance between the obtained vector and the reference vector is less than a threshold value, the two vectors can be determined to be substantially similar to one another. Conversely, in another example, if the cosine distance between the two vectors exceed a threshold value, the two vectors can be determined to be sufficiently different, and this can lead to a conclusion that an additional audio signal (in addition to the output of the speaker device) is present in the first signal. In some implementations, determination of a presence of the additional signal can be made if the vector obtained from the first signal satisfies a threshold condition.

The process 300 further includes initiating a reduction in the audio output level of the speaker device (330) based on determining that the additional audio signal corresponds to the utterance of the user. The reduction can be initiated, for example, by providing a control signal to the speaker device. The control signal may cause a switch-off of the speaker device, or cause a reduction in the audio output level (that can also be referred to as the volume) of the speaker device. A switch-off or level reduction of the audio output of the speaker device results in a captured signal in which an effect of the speaker device output is reduced. For example, if the audio output level of the speaker device is reduced upon detection of a user voice, a dominant part of the signal captured by the microphone after such a reduction may include the spoken input from the user, thereby allowing for more accurate recognition of the spoken input.

In some implementations, the captured signal is provided to a speech recognition engine, and an output of the speech recognition engine is processed using a transcription engine to generate a transcription of the spoken input or utterance. For example, the output of the speech recognition engine can be provided to a language model (e.g., the language model 214 of FIG. 2), and the output of the language model can be provided to a transcription engine (e.g., the transcription engine 216 of FIG. 2) to generate the transcription.

Figure 4:
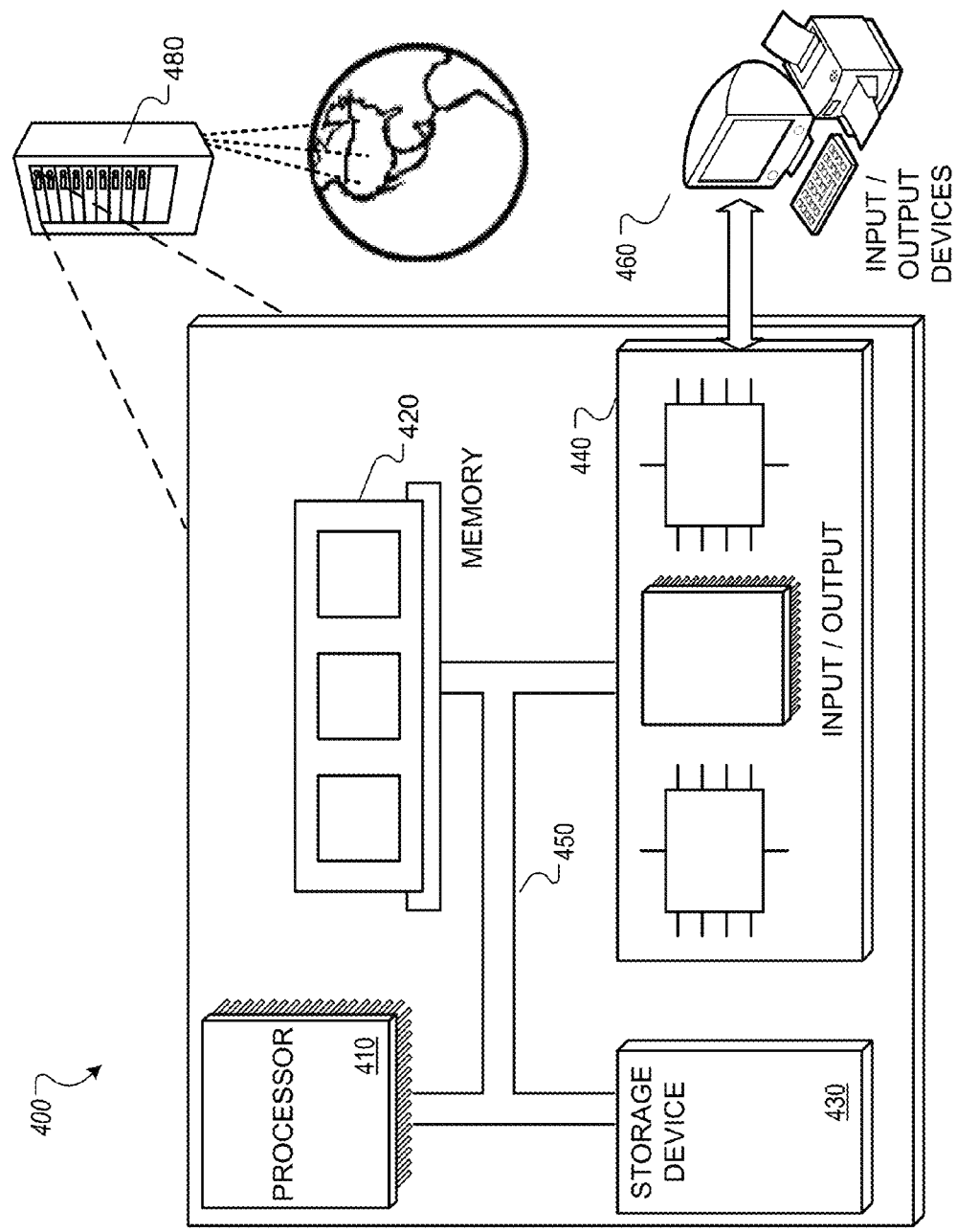
FIG. 4 is a block diagram of an example of a computing device

FIG. 4 is block diagram of an example computer system 400 that may be used in performing the processes described herein. For example, the dialog manager 208, speech recognition engine 212, acoustic model 213, language model 214, and transcription engine 216, can include at least portions of the computing device 400 described below. Computing device 400 is intended to represent various forms of digital computers, such as laptops, desktops, workstations, servers, blade servers, mainframes, and other appropriate computers. Computing device 400 is further intended to represent various typically non-mobile devices, such as televisions or other electronic devices with one or more processors embedded therein or attached thereto. Computing device 400 also represents mobile devices, such as personal digital assistants, touchscreen tablet devices, e-readers, cellular telephones, smartphones.

The system 400 includes a processor 410, a memory 420, a storage device 430, and an input/output module 440. Each of the components 410, 420, 430, and 440 can be interconnected, for example, using a system bus 450. The processor 410 is capable of processing instructions for execution within the system 400. In one implementation, the processor 410 is a single-threaded processor. In another implementation, the processor 410 is a multi-threaded processor. The processor 410 is capable of processing instructions stored in the memory 420 or on the storage device 430.

The memory 420 stores information within the system 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the system 400. In one implementation, the storage device 430 is a computer-readable medium. In various different implementations, the storage device 430 can include, for example, a hard disk device, an optical disk device, or some other large capacity storage device.

The input/output module 440 provides input/output operations for the system 400. In one implementation, the input/output module 440 can include one or more of a network interface devices, e.g., an Ethernet card, a serial communication device, e.g., an RS-232 port, and/or a wireless interface device, e.g., and 802.11 card. In another implementation, the input/output device can include driver devices configured to receive input data and send output data to other input/output devices, e.g., keyboard, printer and display devices 460.

The web server, advertisement server, and impression allocation module can be realized by instructions that upon execution cause one or more processing devices to carry out the processes and functions described above. Such instructions can comprise, for example, interpreted instructions, such as script instructions, e.g., JavaScript or ECMAScript instructions, or executable code, or other instructions stored in a computer readable medium. The web server and advertisement server can be distributively implemented over a network, such as a server farm, or can be implemented in a single computer device.

Example computer system 400 can include a server. Various servers, which may act in concert to perform the processes described herein, may be at different geographic locations, as shown in the figure. The processes described herein may be implemented on such a server or on multiple such servers. As shown, the servers may be provided at a single location or located at various places throughout the globe. The servers may coordinate their operation in order to provide the capabilities to implement the processes.

Although an example processing system has been described in FIG. 4, implementations of the subject matter and the functional operations described in this specification can be implemented in other types of digital electronic circuitry, or in computer software, firmware, or hardware, including the structures disclosed in this specification and their structural equivalents, or in combinations of one or more of them. Implementations of the subject matter described in this specification can be implemented as one or more computer program products, e.g., one or more modules of computer program instructions encoded on a tangible program carrier, for example a non-transitory computer-readable medium, for execution by, or to control the operation of, a processing system. The non-transitory computer readable medium can be a machine readable storage device, a machine readable storage substrate, a memory device, or a combination of one or more of them.

In this regard, various implementations of the systems and techniques described herein can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to a computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be a form of sensory feedback (e.g., visual feedback, auditory feedback, or tactile feedback); and input from the user can be received in a form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or a combination of such back end, middleware, or front end components. The components of the system can be interconnected by a form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

Content, such as ads and GUIs, generated according to the processes described herein may be displayed on a computer peripheral (e.g., a monitor) associated with a computer. The display physically transforms the computer peripheral. For example, if the computer peripheral is an LCD display, the orientations of liquid crystals are changed by the application of biasing voltages in a physical transformation that is visually apparent to the user. As another example, if the computer peripheral is a cathode ray tube (CRT), the state of a fluorescent screen is changed by the impact of electrons in a physical transformation that is also visually apparent. Moreover, the display of content on a computer peripheral is tied to a particular machine, namely, the computer peripheral.

For situations in which the systems and methods discussed here collect personal information about users, or may make use of personal information, the users may be provided with an opportunity to control whether programs or features that may collect personal information (e.g., information about a user's calendar, social network, social actions or activities, a user's preferences, or a user's current location), or to control whether and/or how to receive content that may be more relevant to (or likely to be clicked on by) the user. In addition, certain data may be anonymized in one or more ways before it is stored or used, so that personally identifiable information is removed when generating monetizable parameters (e.g., monetizable demographic parameters). For example, a user's identity may be anonymized so that no personally identifiable information can be determined for the user, or a user's geographic location may be generalized where location information is obtained (such as to a city, ZIP code, or state level), so that a particular location of a user cannot be determined. Thus, the user may have control over how information is collected (and/or used) about him or her.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations may fall within the scope of the following claims.

What is claimed is:

1. A computer implemented method comprising:
providing a text-to-speech prompt for output;
receiving, at a processing system, particular audio data encoding (i) at least a portion of the text-to-speech prompt and (ii) a user utterance;
providing the particular audio data to an additional audio activity detector comprising a model that is trained, using training audio data comprising text-to-speech prompts, to identify whether given audio data comprises additional audio other than a text-to-speech prompt;
receiving, from the additional audio activity detector, data indicating that the particular audio data comprises additional audio other than the text-to-speech prompt; and
in response to receiving the data indicating that the particular audio data comprises additional audio other than the text-to-speech prompt, initiating a reduction in an audio output level of the text-to-speech prompt.

2. The method of claim 1, wherein initiating a reduction in an audio output level of the text-to-speech prompt comprises interrupting output of the text-to-speech prompt.

3. The method of claim 1, further comprising:
generating a transcription corresponding to the user utterance.

4. The method of claim 1, further comprising:
obtaining a first vector corresponding to the text-to-speech prompt;
comparing the first vector to a second vector corresponding to the model; and
determining that the particular audio data comprises additional audio other than the text-to-speech prompt based on a result of the comparison satisfying a threshold.

5. The method of claim 1, further comprising:
obtaining a first vector corresponding to the text-to-speech prompt; and
determining that the particular audio data comprises additional audio other than the text-to-speech prompt based on the first vector satisfying a threshold.

6. The method of claim 1, wherein the model is an i-vector based model.

7. The method of claim 1, wherein the model is a neural network based model.

8. The method of claim 1, wherein the model jointly represents a user voice and the text-to-speech prompt.

9. A system comprising:
one or more computers and one or more storage devices storing instructions that are operable, when executed by the one or more computers, to cause the one or more computers to perform operations comprising:
providing a text-to-speech prompt for output;
receiving, at a processing system, particular audio data encoding (i) at least a portion of the text-to-speech prompt and (ii) a user utterance;
providing the particular audio data to an additional audio activity detector comprising a model that is trained, using training audio data comprising text-to-speech prompts, to identify whether given audio data comprises additional audio other than a text-to-speech prompt;
receiving, from the additional audio activity detector, data indicating that the particular audio data comprises additional audio other than the text-to-speech prompt; and
in response to receiving the data indicating that the particular audio data comprises additional audio other than the text-to-speech prompt, initiating a reduction in an audio output level of the text-to-speech prompt.

10. The system of claim 9, wherein initiating a reduction in an audio output level of the text-to-speech prompt comprises interrupting output of the text-to-speech prompt.

11. The system of claim 9, further comprising:
generating a transcription corresponding to the user utterance.

12. The system of claim 9, further comprising:
obtaining a first vector corresponding to the text-to-speech prompt;
comparing the first vector to a second vector corresponding to the model; and
determining that the particular audio data comprises additional audio other than the text-to-speech prompt based on a result of the comparison satisfying a threshold.

13. The system of claim 9, further comprising:
obtaining a first vector corresponding to the text-to-speech prompt; and
determining that the particular audio data comprises additional audio other than the text-to-speech prompt based on the first vector satisfying a threshold.

14. The system of claim 9, wherein the model is an i-vector based model.

15. The system of claim 9, wherein the model is a neural network based model.

16. The system of claim 9, wherein the model jointly represents a user voice and the text-to-speech prompt.

17. A non-transitory computer readable storage device storing instructions executable by one or more processors which, upon such execution, cause the one or more processors to perform operations comprising:
providing a text-to-speech prompt for output;
receiving, at a processing system, particular audio data encoding (i) at least a portion of the text-to-speech prompt and (ii) a user utterance;
providing the particular audio data to an additional audio activity detector comprising a model that is trained, using training audio data comprising text-to-speech prompts, to identify whether given audio data comprises additional audio other than a text-to-speech prompt;
receiving, from the additional audio activity detector, data indicating that the particular audio data comprises additional audio other than the text-to-speech prompt; and
in response to receiving the data indicating that the particular audio data comprises additional audio other than the text-to-speech prompt, initiating a reduction in an audio output level of the text-to-speech prompt.

18. The computer readable storage device of claim 17, wherein initiating a reduction in an audio output level of the text-to-speech prompt comprises interrupting output of the text-to-speech prompt.

19. The computer readable storage device of claim 17, further comprising:
generating a transcription corresponding to the user utterance.

20. The computer readable storage device of claim 17, further comprising:
obtaining a first vector corresponding to the text-to-speech prompt;
comparing the first vector to a second vector corresponding to the model; and
determining that the particular audio data comprises additional audio other than the text-to-speech prompt based on a result of the comparison satisfying a threshold.

* * * * *